(12) United States Patent
Imai

(10) Patent No.: US 9,438,362 B2
(45) Date of Patent: Sep. 6, 2016

(54) AUDIO MIXING DEVICE, METHOD THEREOF, AND ELECTRONIC DEVICE

(75) Inventor: Yukihiro Imai, Kawanishi (JP)

(73) Assignee: RICOH COMPANY, LTD., Tokyo (JP)

( * ) Notice: Subject to any disclaimer, the term of this patent is extended or adjusted under 35 U.S.C. 154(b) by 678 days.

(21) Appl. No.: 13/371,752

(22) Filed: Feb. 13, 2012

(65) Prior Publication Data

US 2012/0213389 A1 Aug. 23, 2012

(30) Foreign Application Priority Data

Feb. 22, 2011 (JP) ................................. 2011-035894

(51) Int. Cl.
H04B 1/00 (2006.01)
H03F 3/38 (2006.01)
H03F 3/217 (2006.01)
H04H 60/04 (2008.01)

(52) U.S. Cl.
CPC .............. *H04H 60/04* (2013.01); *H03F 3/217* (2013.01); *H03F 2200/331* (2013.01); *H03F 2200/339* (2013.01); *H03F 2200/345* (2013.01); *H03F 2200/351* (2013.01)

(58) Field of Classification Search
CPC ....... H04H 60/04; G10L 19/008; H04S 3/00; H04S 3/008; H04S 1/007; H04R 3/005; H04R 5/04; H04R 2460/01; H04M 3/568; H03F 3/181; H03F 3/217; H03F 3/2173; H03F 3/2171; H03F 2200/351; H03F 2200/331; H03F 2200/78; H03F 2200/339; H03F 2200/345
USPC ........... 381/119; 700/94; 330/10, 251, 207 A
See application file for complete search history.

(56) References Cited

U.S. PATENT DOCUMENTS

| 5,729,225 A * | 3/1998 | Ledzius ........................... 341/61 |
| 6,618,711 B1 * | 9/2003 | Ananth ............................ 706/14 |
| 7,486,155 B2 * | 2/2009 | Clara ....................... H03F 3/217 332/106 |
| 8,618,875 B2 * | 12/2013 | Anazawa ................ H03F 3/217 330/10 |

FOREIGN PATENT DOCUMENTS

JP 9-321630 12/1997
JP 2007-142996 6/2007

* cited by examiner

*Primary Examiner* — Xu Mei
(74) *Attorney, Agent, or Firm* — Cooper & Dunham LLP

(57) ABSTRACT

An audio mixing device includes: an adder that adds a plurality of PDM signals each converted from a plurality of digital audio signals; a D/A converter that performs D/A conversion on a digital audio signal outputted from the adder and outputs an analog audio signal; and a synchronization device that is provided prior to the adder, and that synchronizes each of a plurality of digital signals with one another by use of the same predetermined synchronization timing signal and outputs each of them to the adder.

3 Claims, 5 Drawing Sheets

AUDIO MIXING DEVICE, METHOD THEREOF, AND ELECTRONIC DEVICE

CROSS-REFERENCE TO RELATED APPLICATIONS

The present application is based on and claims priority from Japanese Patent Application Number 2011-035894, filed Feb. 22, 2011, the disclosure of which is hereby incorporated by reference herein in its entirety.

BACKGROUND

The present invention relates to an audio mixing device that mixes a plurality of digital audio signals, performs digital-to-analog conversion (hereinafter, referred to as D/A conversion), and outputs an analog audio signal, a method thereof, and an electronic device including the audio mixing device.

Japanese Patent application publication number 2007-142996 discloses an audio mixing device that mixes digital audio data, performs D/A conversion, and outputs an analog audio signal.

In the present specification, audio data or an audio signal refers to low-frequency data and/or a signal including sound and/or music.

FIG. 5 is a block diagram illustrating a constitution of an audio mixing device according to a conventional technique. In FIG. 5, PDM (Pulse Density Modulation) signal generators 1, 2, 3 generate PDM signals P1, P2, P3, respectively, by performing delta-sigma modulation (Δ-Σ modulation) on inputted digital audio signals S1, S2, S3, respectively, and output the PDM signals P1, P2, P3 to D/A converters 11, 12, 13, respectively. The D/A converters 11, 12, 13 perform D/A conversion on the inputted PDM signals P1, P2, P3, respectively, and output analog audio signals A1, A2, A3 to an adder 14. The adder 14 adds the three inputted analog audio signals A1, A2, A3 and outputs an analog audio signal A10 which is a signal in which the three inputted analog audio signals A1, A2, A3 have been mixed.

SUMMARY

In the audio mixing device according to the conventional technique, the same number of D/A converters as the number of audio data that are mixed are needed. And therefore, there are problems in terms of an increased size of the mixing device, large power consumption, and so on.

An object of the present invention is to solve the above-described problems, and to provide an audio mixing device the constitution of which is simple compared to the conventional technique, and that is capable of suppressing power consumption, a method thereof, and an electronic device including the audio mixing device.

In order to achieve the object of the present invention, an embodiment of the present invention provides an audio mixing device comprising: an adder that adds a plurality of PDM signals each converted from a plurality of digital audio signals; a D/A converter that performs D/A conversion on a digital audio signal outputted from the adder, and outputs an analog audio signal; and a synchronization device that is provided prior to the adder, and that synchronizes each of a plurality of digital signals with one another by use of the same predetermined synchronization timing signal, and outputs each of them to the adder.

In order to achieve the object of the present invention, an embodiment of the present invention provides an audio mixing method comprising: a step of adding a plurality of PDM signals converted from a plurality of digital audio signals, respectively; a step of performing D/A conversion on a digital audio signal that is added in the step of adding and outputting an analog audio signal; and a step of synchronizing each of a plurality of digital signals with one another by use of the same predetermined synchronization timing signal prior to the step of adding and outputting each of them.

DETAILED DESCRIPTION OF THE PREFERRED EMBODIMENTS

Hereinafter, embodiments according to the present invention will be explained with reference to the drawings. In each of the following embodiments, a similar constituent is denoted by the same reference number.

Figure 1:
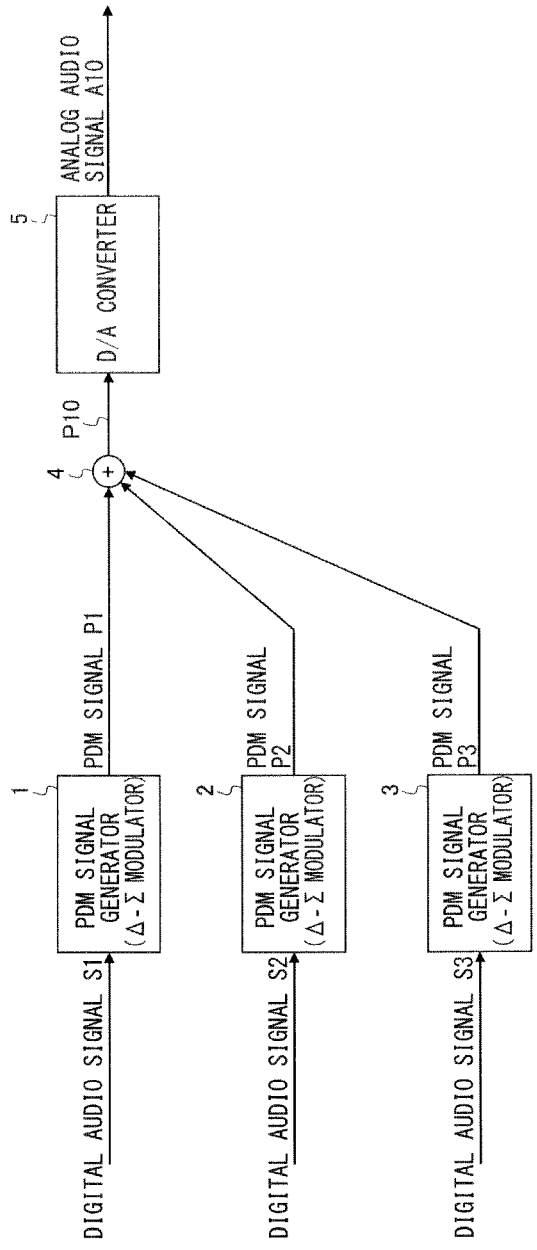
FIG. 1 is a block diagram illustrating a constitution of an audio mixing device according to a first embodiment of the present invention.
Figure 5:
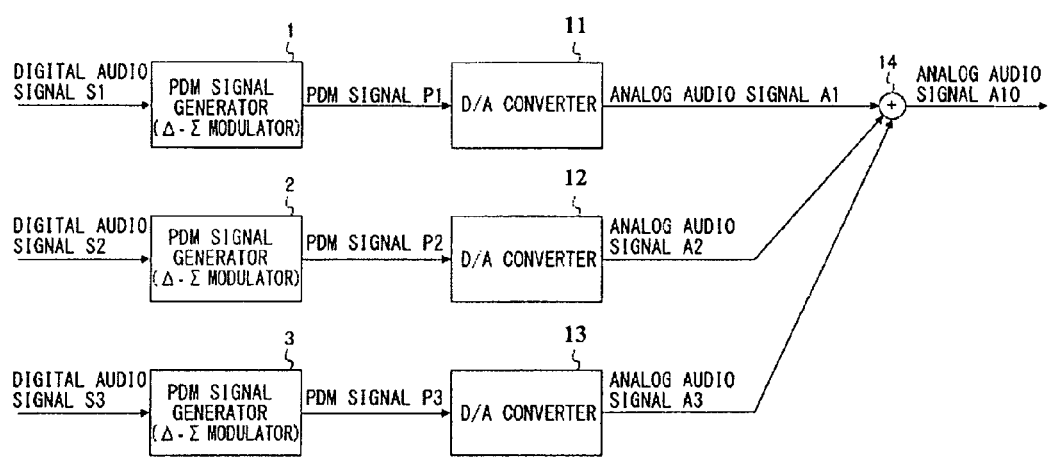
FIG. 5 is a block diagram illustrating a constitution of an audio mixing device according to conventional technique.

FIG. 1 is a block diagram illustrating a constitution of an audio mixing device according to a first embodiment of the present invention. A feature of the audio mixing device according to the present embodiment is that compared to an audio mixing device according to the conventional technique in FIG. 5, a signal operation is performed in order of a digital adder 4 and a D/A converter 5, after PDM signal generators 1, 2, 3.

In FIG. 1, the PDM signal generators 1, 2, 3 generate PDM signals P1, P2, P3, respectively, by performing delta-sigma modulation (Δ-Σ modulation) on inputted digital audio signals S1, S2, S3, respectively, and output the PDM signals P1, P2, P3 to the digital adder 4. Here, the digital audio signals S1, S2, S3 are, for example, 16-bit to 24-bit linear PCM signals, 8-bit A-law signals, or 8-bit μ-law signals. The PDM signal generators 1, 2, 3 include, for example, an interpolation function of an input signal and a delta-sigma modulation function that performs the delta-sigma modulation on an interpolated signal; however, the PDM signal generators 1, 2, 3 may include only the latter delta-sigma modulation function. In a playback of audio signals in a case where PDM signals have been recorded on a recording medium (for example, a case of a super audio CD (SACD)), the PDM signal generators 1, 2, 3 are not needed, and as the audio signals, each of a plurality of PDM signals is inputted to the digital adder 4.

Next, the digital adder 4 adds the three inputted PDM signals P1, P2, P3, and outputs a PDM signal P10 that is a result of the addition to the D/A converter 5. The D/A converter 5 performs D/A conversion on the inputted PDM signal P10 and outputs an analog signal A10.

According to the above-described first embodiment of the present invention, since only one D/A converter 5 is needed to constitute the audio mixing device, it is possible to achieve an audio mixing device the constitution of which is simple compared to the conventional technique and which reduces power consumption.

Figure 2:
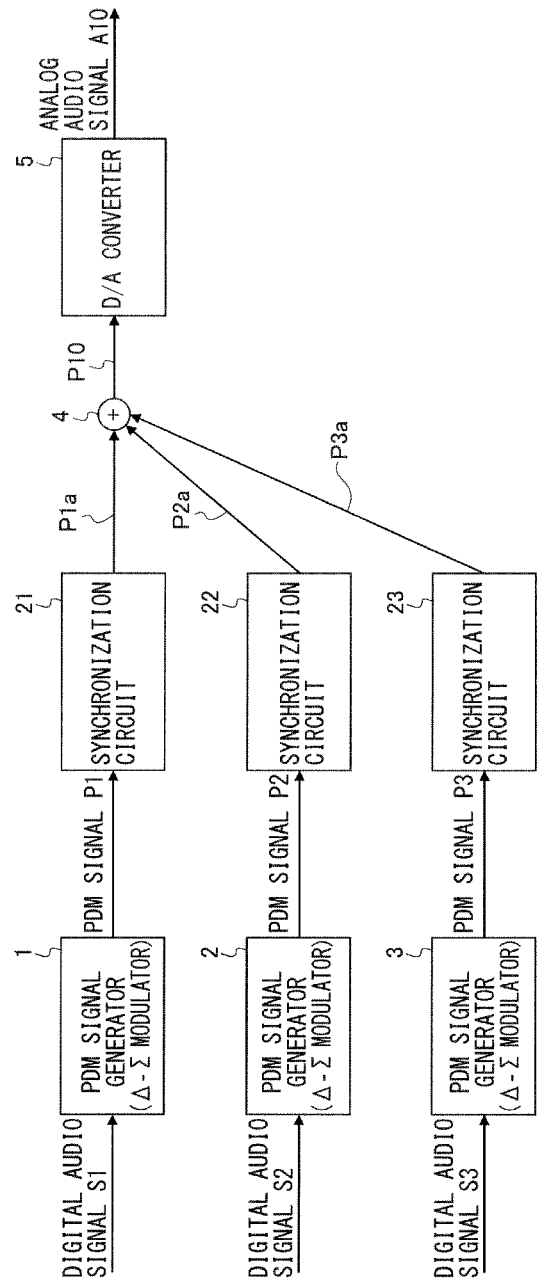
FIG. 2 is a block diagram illustrating a constitution of an audio mixing device according to a second embodiment of the present invention.

FIG. 2 is a block diagram illustrating a constitution of an audio mixing device according to a second embodiment of the present invention. A feature of the audio mixing device according to the second embodiment is that compared to the audio mixing device according to the first embodiment in FIG. 1, between the PDM signal generators 1, 2, 3 and the digital adder 4, synchronization circuits (synchronization devices) 21, 22, 23 are provided, respectively. Here, the synchronization circuits 21, 22, 23 generate synchronized PDM signals P1a, P2a, P3a by synchronizing each of PDM signals P1, P2, P3 outputted from the PDM signal generators 1, 2, 3, respectively, with one another by use of the same predetermined synchronization timing clock, and output the synchronized PDM signals P1a, P2a, P3a to the digital adder 4.

Figure 3:
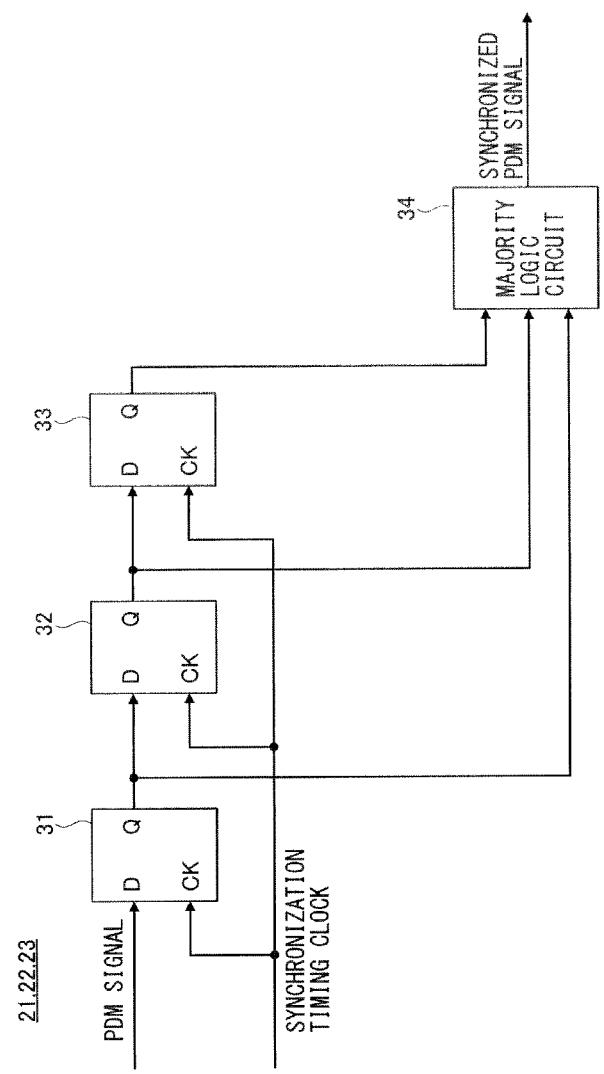
FIG. 3 is a block diagram illustrating a detailed constitution of synchronization circuits 21, 22, 23 in FIG. 2.

FIG. 3 is a block diagram illustrating a detailed constitution of the synchronization circuits 21, 22, 23 in FIG. 2. In FIG. 3, each of the synchronization circuits 21, 22, 23 includes three delayed flip-flops 31, 32, 33 connected in tandem to one another and a majority logic circuit 34. Here, the same predetermined synchronization timing clock is inputted to a clock input of each of the flip-flops 31, 32, 33. The inputted PDM signals are temporarily stored in each of the flip-flops 31, 32, 33 sequentially, and then outputted to the following flip-flops, and outputted to the majority logic circuit 34. The majority logic circuit 34 generates the synchronized PDM signals and outputs them by outputting high-level PDM signals, when at least two signals of the three inputted signals are at a high level.

According to the above-described second embodiment of the present invention, since only one D/A converter 5 is needed to constitute the audio mixing device, it is possible to achieve an audio mixing device the constitution of which is simple compared to the conventional technique and which reduces power consumption. Additionally, since each of a plurality of digital audio signals is synchronized with one another by use of the same predetermined synchronization timing clock and added, even if a plurality of digital audio signals that are added is asynchronous, it is possible to perform an addition operation without rarely deteriorating a signal characteristic.

That is, even in a case where an update timing of each of digital audio signals that are added is asynchronous, it is possible to perform an addition operation without rarely deteriorating a signal characteristic. For example, a mobile phone device has an addition function of transmitted and received data of sound and music data to be played back by the mobile phone device. However, generally an update timing of the transmitted and received data of sound and an update timing of the music data that is played back by the mobile phone device are asynchronous, therefore, conventionally, each signal is converted to an analog signal by a D/A converter and then added. The present embodiment aims to solve those problems.

Figure 4:
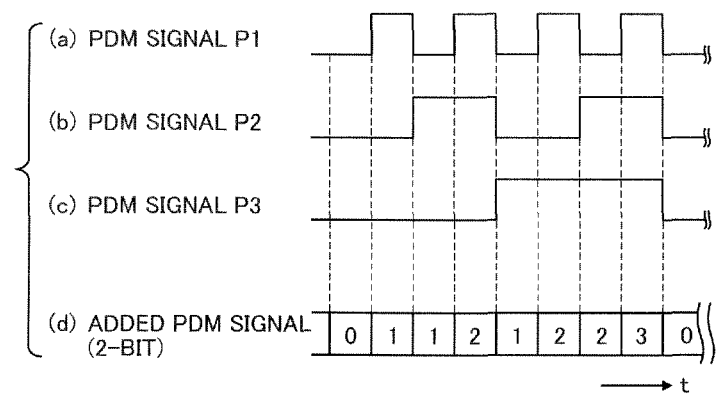
FIG. 4 is a timing diagram illustrating a circuit operation of a digital adder in FIGS. 1 and 2.

FIG. 4 is a timing diagram illustrating a circuit operation of the digital adder 4 in FIGS. 1 and 2. (d) in FIG. 4 denotes the number of inputted high-level PDM signals (additional value). As illustrated in FIG. 4, each value of each of 1-bit PDM signals P1, P2, P3 is added, and a 2-bit PDM signal that denotes the additional value is generated.

In the above-described embodiments, an audio mixing device has been explained; however, the present invention is not limited thereto, and the audio mixing device can be mounted on an electronic device such as a mobile phone, or the like, for example.

In the above-described embodiments, the digital adder 4 that adds three audio signals has been explained; however, the number of audio signals that are added is not limited thereto, and can be plural such as two, or equal to or more than four.

According to the embodiments of the present invention, since only one D/A converter is needed to constitute an audio mixing device, it is possible to provide an audio mixing device a constitution of which is simple compared to the conventional technique and which reduces power consumption, a method thereof, and an electronic device having the audio mixing device. In addition, since each of a plurality of digital audio signals is synchronized with one another by use of the same predetermined synchronization timing clock and added, even if a plurality of digital audio signals that are added is asynchronous, it is possible to perform an addition operation without rarely deteriorating a signal characteristic.

Although the present invention has been described in terms of exemplary embodiments, it is limited thereto. It should be appreciated that variations may be made in the embodiments described by persons skilled in the art without departing from the scope of the present invention as defined by the following claims.

What is claimed is:

1. An audio mixing device, comprising:
a plurality of pulse density modulation (PDM) signal generators that receive a plurality of respective digital audio signals and perforin pulse density modulation (PDM) on the received digital audio signals to generate a plurality of respective PDM signals;
a synchronization device that synchronizes each of the plurality of PDM signals with one another by use of a same predetermined synchronization timing signal, to generate a plurality of respective synchronized PDM signals;
an adder that adds the plurality of synchronized PDM signals to generate a digital audio signal; and
a D/A converter that performs D/A conversion on the digital audio signal generated by the adder, to generate an analog audio signal.

2. An electronic device comprising:
the audio mixing device according to claim 1.

3. An audio mixing method, performed by an audio mixing device, the method comprising:
(a) performing pulse density modulation (PDM) on a plurality of digital audio signals to generate a plurality of respective PDM signals;
(b) synchronizing each of the plurality of PDM signals with one another by use of a same predetermined synchronization timing signal, to generate a plurality of respective synchronized PDM signals;
(c) adding, by the audio mixing device, the plurality of synchronized PDM signals to generate a digital audio signal; and
(d) performing, by the audio mixing device, D/A conversion on the digital audio signal that was generated in (c), to generate an analog audio signal.

* * * * *